United States Patent
Ruiz Holguin et al.

(10) Patent No.: US 11,805,618 B2
(45) Date of Patent: Oct. 31, 2023

(54) OVER-RACK STRUCTURE FOR ELECTRONIC EQUIPMENT RACKS

(71) Applicant: Dell Products L.P., Round Rock, TX (US)

(72) Inventors: Luis Alejandro Ruiz Holguin, Round Rock, TX (US); Tony P. Middleton, Cedar Park, TX (US); Mark M. Bailey, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 60 days.

(21) Appl. No.: 17/505,783

(22) Filed: Oct. 20, 2021

(65) Prior Publication Data
US 2023/0117815 A1    Apr. 20, 2023

(51) Int. Cl.
*H05K 7/18*    (2006.01)
*H05K 5/02*    (2006.01)

(52) U.S. Cl.
CPC ............... *H05K 7/18* (2013.01); *H05K 5/02* (2013.01)

(58) Field of Classification Search
None
See application file for complete search history.

(56) References Cited

U.S. PATENT DOCUMENTS

| | | | | |
|---|---|---|---|---|
| 8,320,125 B1* | 11/2012 | Hamburgen | ............. | G06F 1/20 |
| | | | | 361/679.48 |
| 8,469,782 B1* | 6/2013 | Roy | ............. | H05K 7/20745 |
| | | | | 62/119 |
| 10,244,652 B1* | 3/2019 | Czamara | ............. | H05K 7/1489 |
| 10,261,279 B1* | 4/2019 | Potter | ............. | G02B 6/4452 |
| 10,334,748 B1* | 6/2019 | Kostenko | ............. | H05K 7/026 |
| 10,548,244 B2* | 1/2020 | Rimler | ............. | F24F 13/32 |
| 10,869,405 B1* | 12/2020 | Bailey | ............. | H05K 7/1492 |
| 2004/0231248 A1* | 11/2004 | Walker | ............. | E04H 3/08 |
| | | | | 52/27 |
| 2008/0017760 A1* | 1/2008 | Larsen | ............. | H02G 3/0443 |
| | | | | 248/49 |
| 2010/0315775 A1* | 12/2010 | Grantham | ............. | H05K 7/20745 |
| | | | | 361/688 |
| 2011/0074117 A1* | 3/2011 | Caveney | ............. | H02G 3/22 |
| | | | | 277/607 |

(Continued)

OTHER PUBLICATIONS whatis.com, "Hot/Cold Aisle," https://searchdatacenter.techtarget.com/definition/hot-cold-aisle, Accessed Oct. 17, 2021, 3 pages.

*Primary Examiner* — James Wu
*Assistant Examiner* — Christopher L Augustin
(74) *Attorney, Agent, or Firm* — Ryan, Mason & Lewis, LLP (57) ABSTRACT

An apparatus comprises a body portion configured to be disposed above an electronic equipment rack. The apparatus further comprises one or more first openings in the body portion. The one or more first openings are configured for receiving a first plurality of cables routed through the one or more first openings. At least one bracket is attached to a side surface of the body portion and configured to be attached to a top surface of the electronic equipment rack. The at least one bracket comprises one or more second openings configured for receiving a second plurality of cables routed through the one or more second openings into the electronic equipment rack.

23 Claims, 10 Drawing Sheets

(56) References Cited

U.S. PATENT DOCUMENTS

| | | | | |
|---|---|---|---|---|
| 2011/0100668 A1* | 5/2011 | Syed | ................... | H05K 7/1491 29/745 |
| 2012/0292278 A1* | 11/2012 | Schluter | ............... | H05K 7/1421 211/183 |
| 2015/0255971 A1* | 9/2015 | Dean | ........................ | F16L 3/26 248/58 |
| 2021/0127523 A1* | 4/2021 | Bailey | ................. | H05K 7/1491 |

* cited by examiner

OVER-RACK STRUCTURE FOR ELECTRONIC EQUIPMENT RACKS

FIELD

The field relates generally to electronic equipment, and more particularly to a component structure installed over electronic equipment racks.

BACKGROUND

Modular datacenters may include static and dynamic electronic equipment racks that are isolated from vibration inside a modular datacenter enclosure. Such isolation protects the electronic equipment racks against vibration and/or shock events at customer sites and/or while modules are being transported to the customer sites. The electronic equipment racks need to be secured to isolation structures integrated in the modular datacenters.

SUMMARY

Illustrative embodiments provide an assembly for installation above electronic equipment racks.

In one embodiment, an apparatus comprises a body portion configured to be disposed above an electronic equipment rack. The apparatus further comprises one or more first openings in the body portion. The one or more first openings are configured for receiving a first plurality of cables routed through the one or more first openings. At least one bracket is attached to a side surface of the body portion and configured to be attached to a top surface of the electronic equipment rack. The at least one bracket comprises one or more second openings configured for receiving a second plurality of cables routed through the one or more second openings into the electronic equipment rack.

Such an arrangement advantageously provides a flexible and multi-purpose design that allows electronic equipment racks to be secured inside a modular datacenter and isolated from external vibratory motion, while providing pathways for power and/or data cables in multiple directions. Illustrative embodiments are adaptable to accommodate a variety of rack configurations and customer design constraints, while providing necessary structural support and meeting cabling requirements.

These and other embodiments include, without limitation, apparatus, systems and methods.

DETAILED DESCRIPTION

Illustrative embodiments will be described herein with reference to exemplary cable supporting and routing assemblies (also referred to herein as "over-rack assemblies") and component configurations installed over electronic equipment racks. It is to be appreciated, however, that the embodiments are not restricted to the particular illustrative configurations shown. Terms such as "electronic equipment racks" as used herein are intended to be broadly construed, so as to encompass, for example, a wide variety of arrangements of housings for electronic equipment, such as, but not necessarily limited to, chassis and frames, which may be used to house different arrangements of storage drives, processors, servers or other types of computer components and electronic equipment.

Figure 1A:
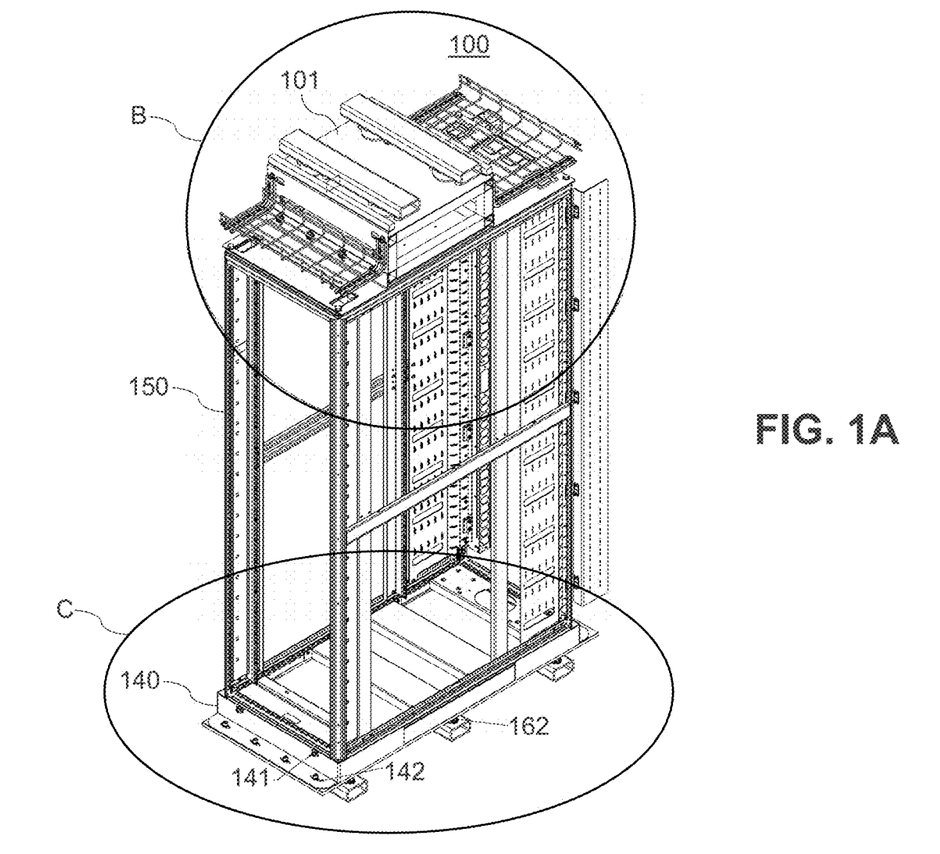
FIG. 1A depicts a schematic perspective view of a cable supporting and routing assembly installed on top of an electronic equipment rack in an illustrative embodiment.
Figure 1B:
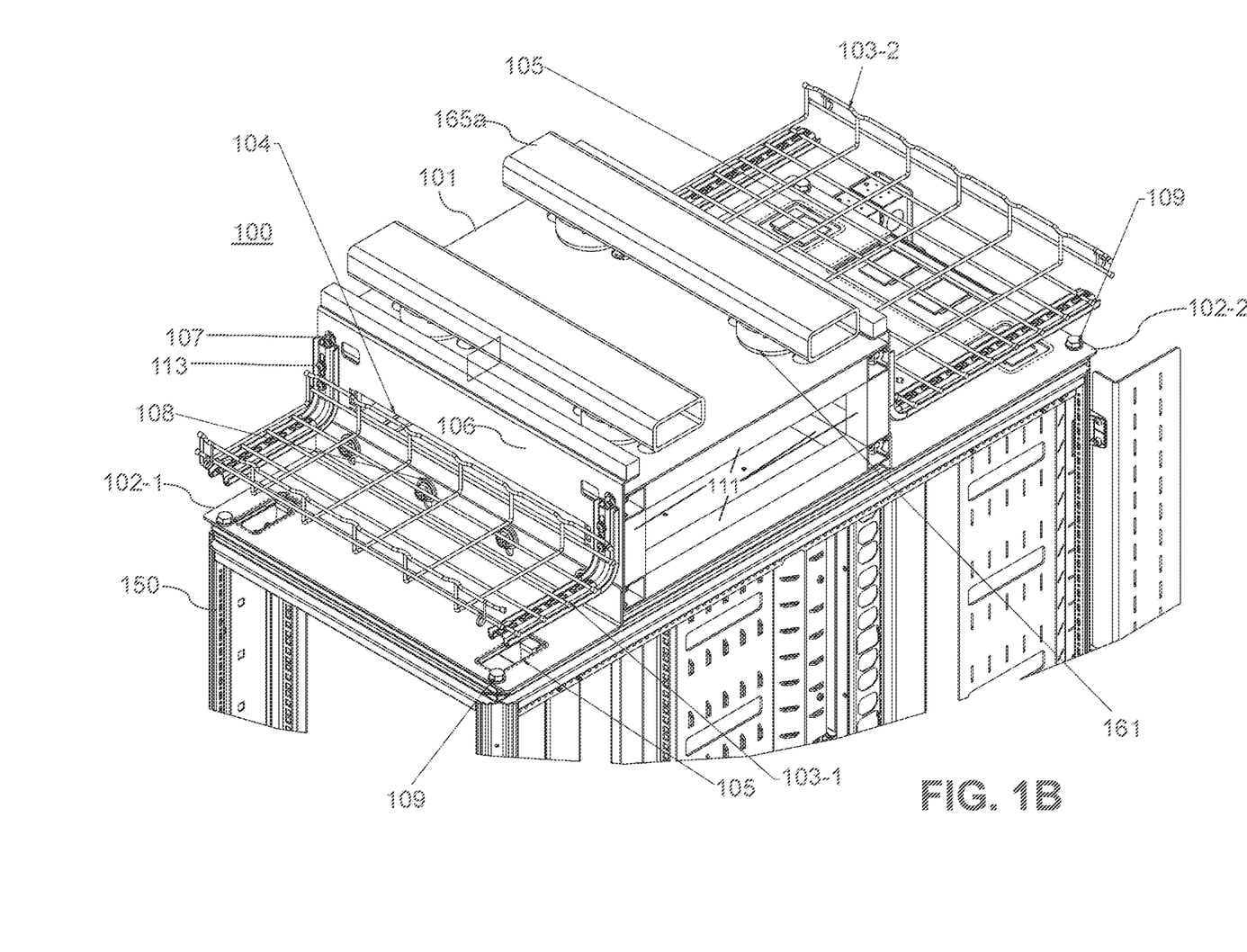
FIG. 1B depicts an enlarged image of the circled portion B of FIG. 1A in an illustrative embodiment.

Referring to FIGS. 1A and 1B, a cable supporting and routing assembly 100 is installed on an electronic equipment rack 150. The cable supporting and routing assembly 100 comprises a body portion 101 disposed above the electronic equipment rack 150 and attached to a plurality of isolation elements 161 (in this example four isolation elements 161).

Figure 1C:
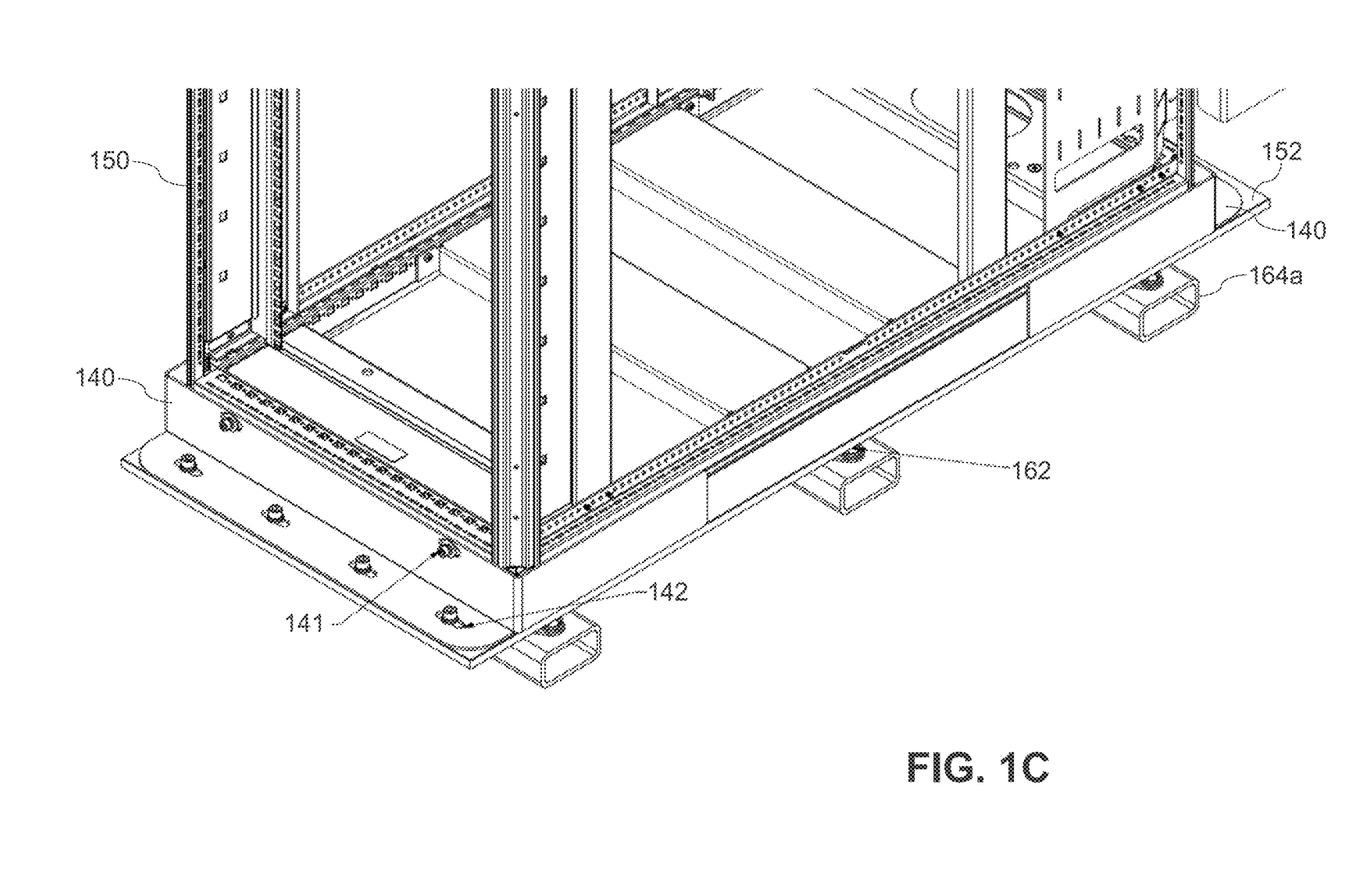
FIG. 1C depicts an enlarged image of the circled portion C of FIG. 1C in an illustrative embodiment.
Figure 1D:
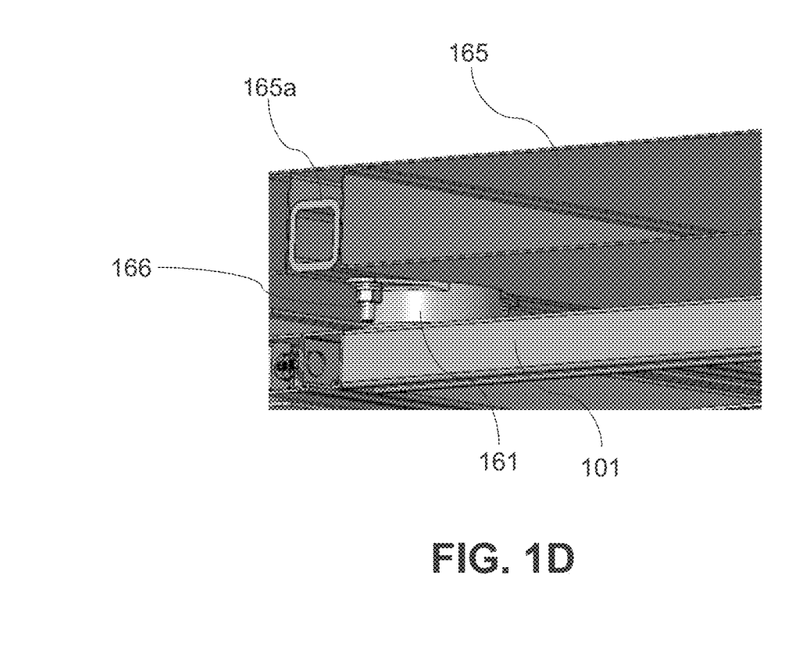
FIG. 1D depicts a schematic perspective view of an isolation element disposed between a top surface of a body portion of a cable supporting and routing assembly and a ceiling of a modular datacenter in an illustrative embodiment.
Figure 1E:
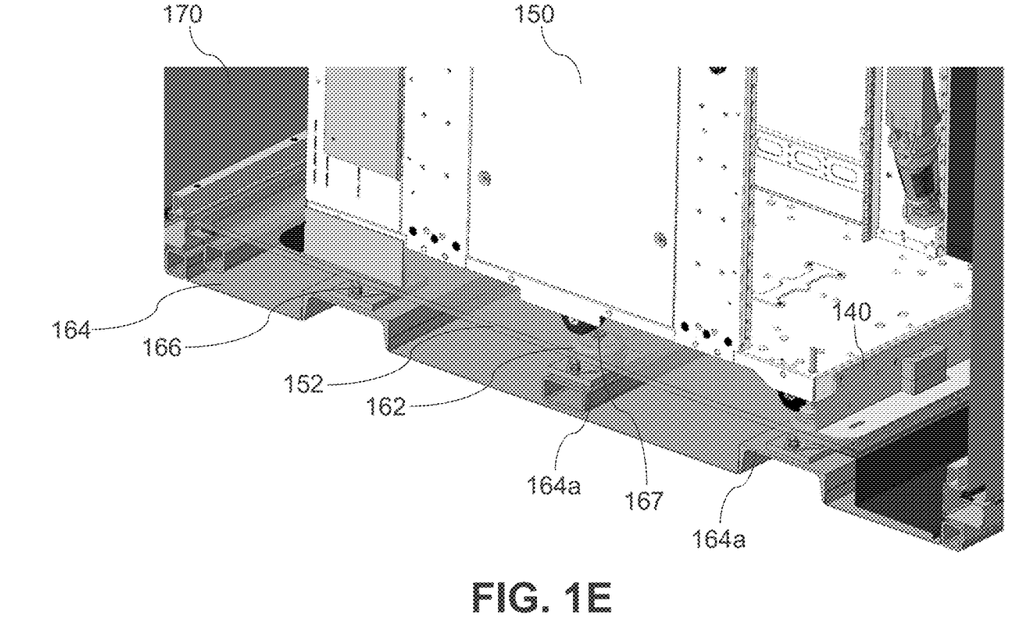
FIG. 1E depicts a schematic perspective view of an isolation element disposed between a base portion on which the electronic equipment rack rests and a floor of a modular datacenter in an illustrative embodiment.

Referring to FIGS. 1A-1E, isolation elements 161 are attached to portions 165a of a ceiling 165 of a modular datacenter 170 between the ceiling 165 of the modular datacenter and a top surface of the body portion 101. Isolation elements 162 are also disposed between a base portion 152 on which the electronic equipment rack 150 rests and portions 164a of a floor 164 of the modular datacenter 170. The isolation elements 161/162 comprise, for example, elastomeric vibration isolators. The isolation elements 161/162 are one-piece molded neoprene mounts with encapsulated metal inserts. The metal inserts provide multi-directional (e.g., all-directional) resistance for horizontally and vertically applied loads. According to a non-limiting example embodiment, each isolation element 161/162 incorporates two-bolt down holes on the load surface (e.g., surface attached to the portions 165a of ceiling 165 or portions 164a of floor 164). As can be seen in FIGS. 1D and 1E, the two-bolt down portions receive fasteners 166 which are driven into the portions 165a of ceiling 165 or portions 164a of floor 164. The isolation elements 161/162 further comprise a steel top load plate 167 for attachment to the top surface of the body portion 101 or the base portion 152 on which the electronic equipment rack 150 rests.

The body portion 101 includes side surfaces 106 attached to a frame 111 of the body portion 101 by fasteners 107, and includes cable trays 103-1 and 103-2 mounted to right and left side surfaces 106 and to the frame 111 of the body portion 101 via, for example, a plurality of fasteners 113. The cable trays 103-1 and 103-2 are configured for supporting data and/or power cables to be used for electronic equipment in the electronic equipment rack 150 and/or in the modular datacenter 170. The cables can include, but are not necessarily limited to, hot aisle cables (e.g., power distribution unit (PDU) whips from a busway and/or data cables) and cold aisle cables (e.g., data cables). Data cables may comprise fiber and/or copper cables. A cold aisle may face cold air source ducts (e.g., air conditioner output ducts), while a hot aisle may face cold air source return ducts (e.g., air conditioner return ducts). As explained in more detail herein, according to the embodiments, hot aisles and cold aisles are contained so that they are isolated from each other to prevent the cold and hot air from mixing. According to the embodiments, as described in more detail in connection with FIGS. 3A and 4-6, containment is accomplished using brush and blanking panels or other physical barriers. Hot aisle and cold aisle configurations conserve energy and lower cooling costs by managing air flow.

The body portion 101 includes openings 104 on left and right sides thereof. The openings 104 are configured to receive cables routed through the openings 104 into the body portion 101 to another side of the body portion 101 or into the electronic equipment rack 150 through openings in the top surface of the electronic equipment rack 150. The cables may be supported by the cable trays 103-1 and/or 103-2 on left and right sides of the body portion 101. In one or more embodiments, one side of an opening 104 in the body portion 101 may be a hot or cold aisle, while the other side of the opening 104 may be the opposite type of aisle, so that the opening 104 separates hot and cold aisles. In this case, the opening 104 may comprise a brush panel therein or positioned adjacent the opening 104, which allows cables to pass through the opening 104, but prevents airflow from passing through the opening 104. A brush panel maintains airflow separation between hot and cold aisles. For example, a side of an opening 104 facing a cable tray 103-1 or 103-2 may be a hot aisle, while the other side of the opening 104 (e.g., facing an interior of the body portion 101) may be a cold aisle. Alternatively, one or more of the openings 104 may include a blanking panel therein or positioned adjacent the opening 104, which blocks airflow and also does not allow passage of cables therethrough.

Brackets 102-1 and 102-2 are attached to right and left side surfaces of the body portion 101 via, for example, fasteners 108. The brackets 102-1 and 102-2 are attached to a top surface of the electronic equipment rack 150 via, for example, fasteners 109. According to one or more embodiment, the brackets 102-1 and 102-2 comprise airflow containment brackets. For example, the brackets 102-1 and 102-2 comprise one or more openings 105 configured for receiving cables routed through the openings 105 into the electronic equipment rack 150. The cables may be supported by the cable trays 103-1 and/or 103-2 on left and right sides of the body portion 101. Similar to the openings 104, in one or more embodiments, one side of an opening 105 in a bracket 102-1 or 102-2 may be a hot or cold aisle, while the other side of the opening 105 may be the opposite type of aisle, so that the opening 105 separates hot and cold aisles. In this case, the opening 105 may comprise a brush panel therein or adjacent the opening 105, which allows cables to pass through the opening 105, but prevents airflow from passing through the opening 105. Alternatively, one or more of the openings 105 may include a blanking panel therein or adjacent the opening 105, which blocks airflow and also does not allow passage of cables therethrough. A side of an opening 105 facing a cable tray 103-1 or 103-2 may be a hot aisle, while the other side of the opening 105 (e.g., facing an interior of the electronic equipment rack 150) may be a cold aisle.

As can be seen in FIGS. 1A and 1B, the brackets 102-1 and 102-2 each comprise an L-shape including a first portion parallel to the top surface of the electronic equipment rack 150 and a second portion perpendicular to the first portion. The first portions are attached to the top surface of the electronic equipment rack 150 via, for example, the fasteners 109 and the second portions are attached to the side surfaces 106 of the body portion 101 via, for example, the fasteners 108. The first portions comprise the openings 105. The cable trays 103-1 and 103-2 are attached to the side surfaces of the body portion 101 above the brackets 102-1 and 102-2.

Referring to FIGS. 1C and 1E, bottom closeout brackets 140 are attached to left and right sides of the electronic equipment rack 150 via, for example, fasteners 141 and to the base portion 152 on which the electronic equipment rack 150 rests via, for example, fasteners 142. The bottom closeout brackets 140 prevent airflow from flowing under the electronic equipment rack 150. The bottom closeout brackets 140 comprise a first portion on the base portion 152 and a second portion extending vertically (e.g., perpendicularly) from an edge of the first portion. The first and second portions each include a plurality of holes through the first and second portions for receiving the fasteners 142 and 141. In order to secure the bottom closeout brackets 140 to the electronic equipment rack 150, fasteners 141 are inserted through the holes in the second portion into holes in the side surfaces of the electronic equipment rack 150. In order to secure the bottom closeout brackets 140 to the base portion 152, fasteners 142 are inserted through holes in the first portion into holes in the base portion 152. The number of holes in the bottom closeout bracket 140, electronic equipment rack 150 and the base portion 152 are not limited to what is shown in FIGS. 1C and 1E, and there may be more or less holes. The holes may be threaded or not threaded.

Figures 2A, 2B:
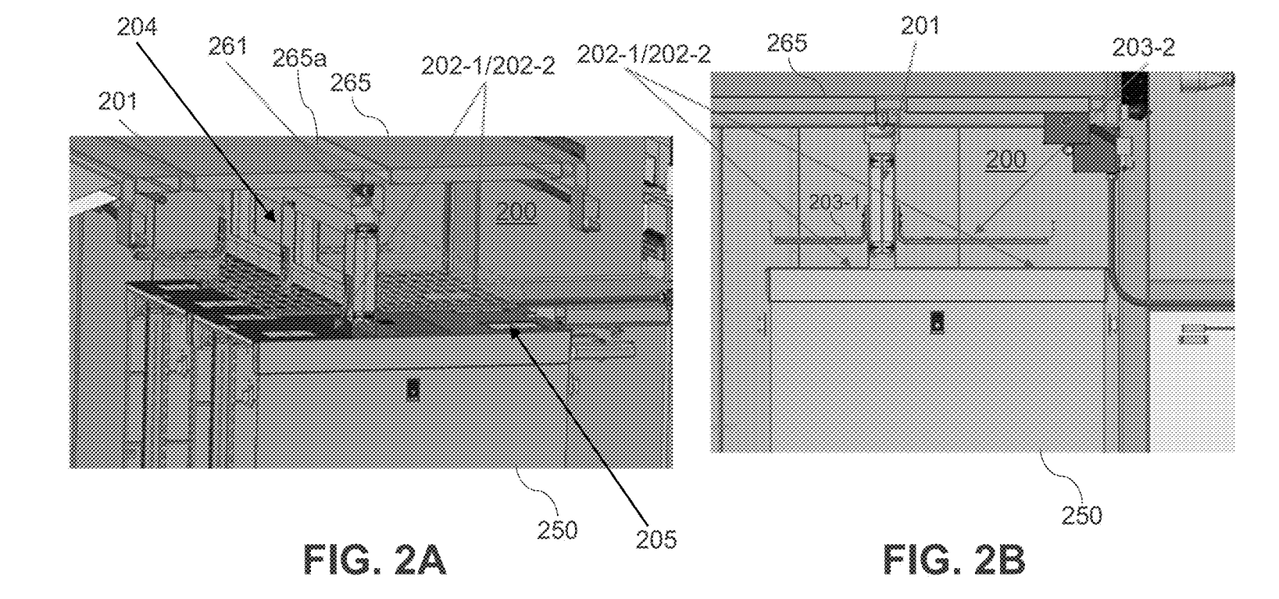
FIG. 2A depicts a schematic perspective view of a cable supporting and routing assembly installed on top of an electronic equipment rack in an illustrative embodiment.
FIG. 2B depicts a schematic side view of the cable supporting and routing assembly of FIG. 2A in an illustrative embodiment.

FIGS. 2A and 2B show another embodiment of a cable supporting and routing assembly 200 installed on an electronic equipment rack 250. Similar reference numerals in FIGS. 2A and 2B to those in FIGS. 1A-1E denote the same or similar elements as those in FIGS. 1A-1E. The cable supporting and routing assembly 200 comprises a body portion 201 disposed above the electronic equipment rack 250 and attached to one or more isolation elements 261 similar to the isolation elements 161. The isolation elements 261 are attached to a portion 265a of a ceiling 265 of a modular datacenter between the ceiling 265 of the modular datacenter and a top surface of the body portion 201. The body portion 201 is narrower in width (left to right in FIG. 2B) than the width of the body portion 101.

The body portion 201 includes side surfaces and cable trays 203-1 and 203-2 mounted to right and left side surfaces of the body portion 201 via, for example, fasteners similar to the plurality of fasteners 113. Like the cable trays 103-1 and 103-2, the cable trays 203-1 and 203-2 are configured for supporting data and/or power cables to be used for electronic equipment in the electronic equipment rack 250 and/or in the modular datacenter. The body portion 201 includes openings 204 on left and right sides thereof. The openings 204 are configured to receive cables routed through the openings 204 into the body portion 201 to another side of the body portion 201 or into the electronic equipment rack 250 through openings in the top surface of the electronic equipment rack 250. The cables may be supported by the cable trays 203-1 and/or 203-2 on left and right sides of the body portion 201. In one or more embodiments, one side of an opening 204 in the body portion 201 may be a hot or cold aisle, while the other side of the opening 204 may be the opposite type of aisle, so that the opening 204 separates hot and cold aisles. In this case, the opening 204 may comprise a brush panel therein or adjacent the opening 204, which allows cables to pass through the opening 204, but prevents airflow from passing through the opening 204. Alternatively, one or more of the openings 204 may include a blanking panel therein or adjacent the opening 204, which blocks airflow and also does not allow passage of cables therethrough. A side of an opening 204 facing a cable tray 203-1 or 203-2 may be a hot aisle, while the other side of the opening 204 (e.g., facing an interior of the body portion 201) may be a cold aisle.

Brackets 202-1 and 202-2 are attached to right and left side surfaces of the body portion 201 via, for example, fasteners similar to fasteners 108. The brackets 202-1 and 202-2 are attached to a top surface of the electronic equipment rack 250 via, for example, fasteners similar to fasteners 109. According to one or more embodiments, the brackets 202-1 and 202-2 comprise airflow containment brackets. For example, the brackets 202-1 and 202-2 comprise one or more openings 205 configured for receiving cables routed through the openings 205 into the electronic equipment rack 250. The cables may be supported by the cable trays 203-1 and/or 203-2 on left and right sides of the body portion 201. Similar to the openings 204, in one or more embodiments, one side of an opening 205 in a bracket 202-1 or 202-2 may be a hot or cold aisle, while the other side of the opening 205 may be the opposite type of aisle, so that the opening 205 separates hot and cold aisles. In this case, the opening 205 may comprise a brush panel therein or adjacent the opening 205, which allows cables to pass through the opening 205, but prevents airflow from passing through the opening 205. Alternatively, one or more of the openings 205 may include a blanking panel therein or adjacent the opening 205, which blocks airflow and also does not allow passage of cables therethrough. A side of an opening 205 facing a cable tray 203-1 or 203-2 may be a hot aisle, while the other side of the opening 205 (e.g., facing an interior of the electronic equipment rack 250) may be a cold aisle.

As can be seen in FIGS. 2A and 2B, the brackets 202-1 and 202-2 each comprise an L-shape including a first portion parallel to the top surface of the electronic equipment rack 250 and a second portion perpendicular to the first portion. The first portions are attached to the top surface of the electronic equipment rack 250 via, for example, the fasteners similar to the fasteners 109 and the second portions are attached to the side surfaces of the body portion 201 via, for example, fasteners similar to the fasteners 108. The first portions comprise the openings 205. The cable trays 203-1 and 203-2 are attached to the side surfaces of the body portion 201 above the brackets 202-1 and 202-2.

FIGS. 3A, 3B, 4 and 5 show another embodiment of a cable supporting and routing assembly 300 installed on an electronic equipment rack 350. Similar reference numerals in FIGS. 3A, 3B, 4 and 5 to those in FIGS. 1A-1E, 2A and 2B denote the same or similar elements as those in FIGS. 1A-1E, 2A and 2B. The cable supporting and routing assembly 300 comprises a body portion 301 disposed above the electronic equipment rack 350 and attached to one or more isolation elements 361 similar to the isolation elements 161 and 261. The isolation elements 361 are attached to a portion 365a of a ceiling 365 of a modular datacenter between the ceiling 365 of the modular datacenter and a top surface of the body portion 301. The body portion 301 is narrower in width (left to right in FIG. 3B) than the width of the body portion 101.

Figure 3A:
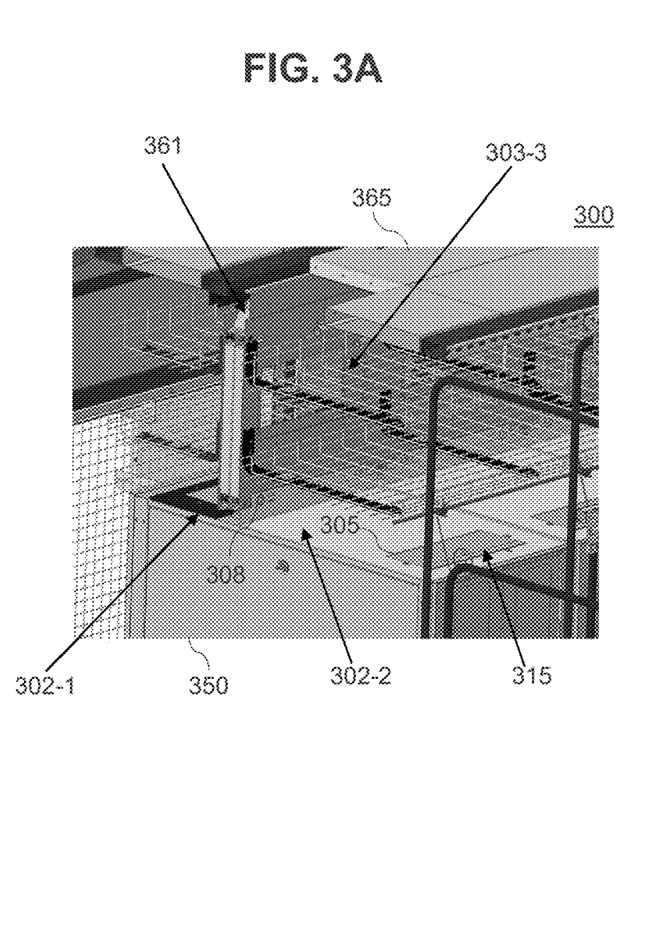
FIG. 3A depicts a schematic perspective view of a cable supporting and routing assembly installed on top of an electronic equipment rack in an illustrative embodiment.
Figure 3B:
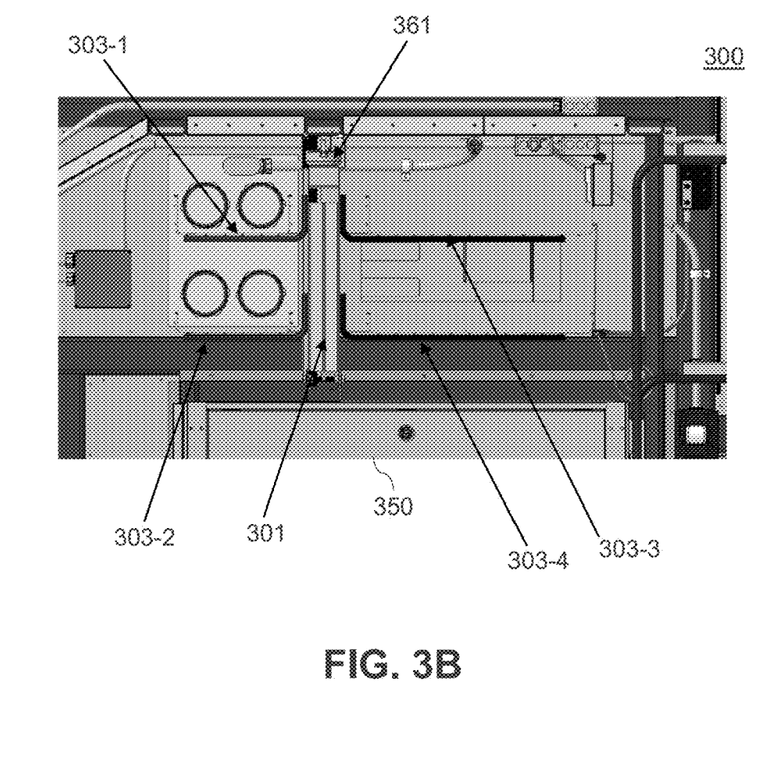
FIG. 3B depicts a schematic side view of the cable supporting and routing assembly of FIG. 3A in an illustrative embodiment.
Figure 4:
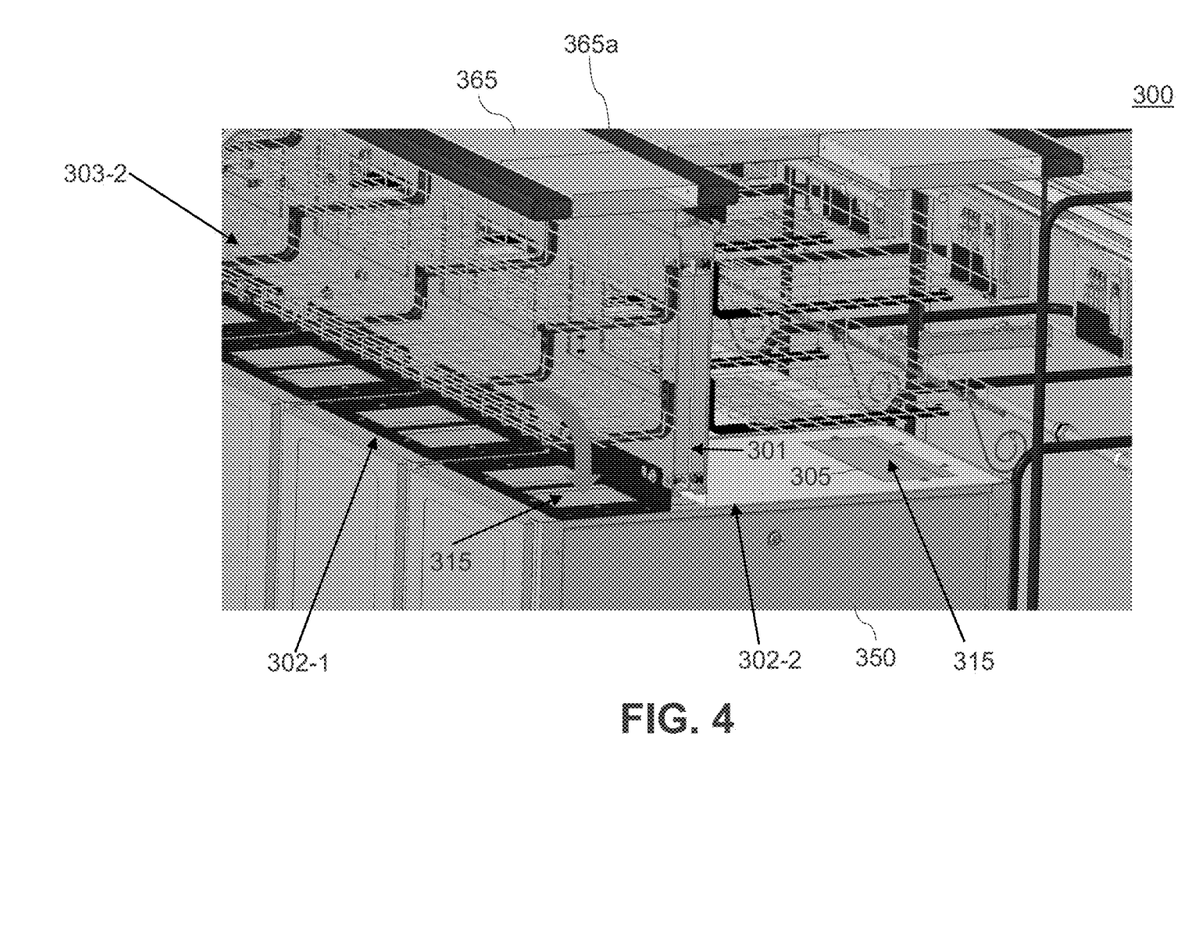
FIG. 4 depicts an additional schematic perspective view of the cable supporting and routing assembly of FIG. 3A in an illustrative embodiment.
Figure 5:
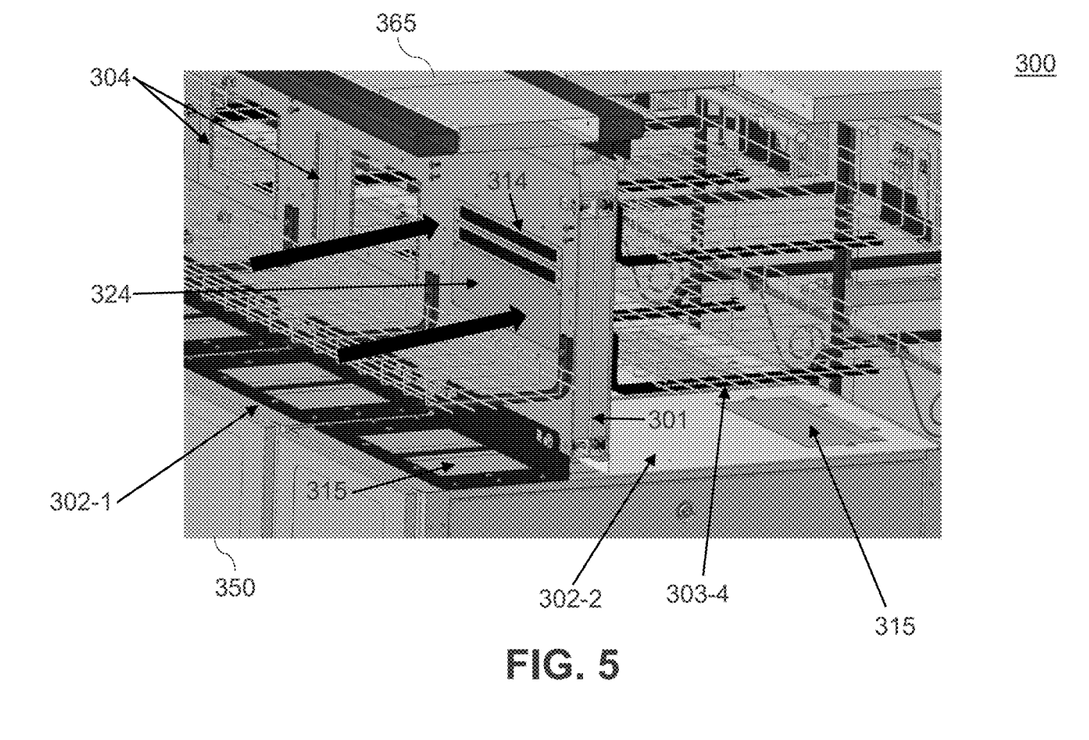
FIG. 5 depicts a schematic perspective view of the cable supporting and routing assembly of FIG. 3A modified to include blanking panels in an illustrative embodiment.

The body portion 301 includes side surfaces and cable trays 303-1, 303-2, 303-3 and 303-4 mounted to right and left side surfaces of the body portion 301 via, for example, fasteners similar to the plurality of fasteners 113. Like the cable trays 103-1 and 103-2 (also 203-1 and 203-2), the cable trays 303-1, 303-2, 303-3 and 303-4 are configured for supporting data and/or power cables to be used for electronic equipment in the electronic equipment rack 350 and/or in the modular datacenter. The body portion 301 includes openings 304 on left and right sides thereof. The openings 304 are configured to receive cables routed through the openings 304 into the body portion 301 to another side of the body portion 301 or into the electronic equipment rack 350 through openings in the top surface of the electronic equipment rack 350. The cables may be supported by the cable trays 303-1, 303-2, 303-3 and/or 303-4 on left and right sides of the body portion 301. In one or more embodiments, one side of an opening 304 in the body portion 301 may be a hot or cold aisle, while the other side of the opening 304 may be the opposite type of aisle, so that the opening 304 separates hot and cold aisles. In this case, the opening 304 may comprise a brush panel therein or adjacent the opening, which allows cables to pass through the opening 304, but prevents airflow from passing through the opening 304. Alternatively, as shown in FIG. 5 one or more of the openings 304 may include blanking panels 314/324 therein or adjacent the openings 304, which block airflow (as shown by thick arrows) and also do not allow passage of cables therethrough. A side of an opening 304 facing a cable tray 303-1, 303-3, 303-3 or 303-4 may be a hot aisle, while the other side of the opening 304 (e.g., facing an interior of the body portion 301) may be a cold aisle.

Brackets 302-1 and 302-2 are attached to right and left side surfaces of the body portion 301 via, for example, fasteners 308 similar to fasteners 108. The brackets 302-1 and 302-2 are attached to a top surface of the electronic equipment rack 350 via, for example, fasteners similar to fasteners 109. According to one or more embodiment, the brackets 302-1 and 302-2 comprise airflow containment brackets. For example, the brackets 302-1 and 302-2 comprise one or more openings 305 configured for receiving cables routed through the openings 305 into the electronic equipment rack 350. The cables may be supported by the cable trays 303-1, 303-2, 303-3 and/or 303-4 on left and right sides of the body portion 301. Similar to the openings 304, in one or more embodiments, one side of an opening 305 in a bracket 302-1 or 302-2 may be a hot or cold aisle, while the other side of the opening 305 may be the opposite type of aisle, so that the opening 305 separates hot and cold aisles. In this case, as shown in FIGS. 3A, 4 and 5, the opening 305 may comprise a brush panel 315 therein or adjacent the opening 305, which allows cables to pass through the opening 305, but prevents airflow from passing through the opening 305. The large curved arrow between the cable tray 303-2 and the brush panel 315 illustrates a possible path of cables or other wires from the cable tray 303-2 through the brush panel 315 and opening 305 into the electronic equipment rack 350. Alternatively, one or more of the openings 305 may include a blanking panel therein or adjacent the opening 305, which blocks airflow and also does not allow passage of cables therethrough. A side of an opening 305 facing a cable tray 303-3 or 303-4 may be a hot aisle, while the other side of the opening 305 (e.g., facing an interior of the electronic equipment rack 350) may be a cold aisle.

As can be seen in FIGS. 3A, 3B, 4 and 5, the brackets 302-1 and 302-2 each comprise an L-shape including a first portion parallel to the top surface of the electronic equipment rack 350 and a second portion perpendicular to the first portion. The first portions are attached to the top surface of the electronic equipment rack 350 via, for example, the fasteners similar to the fasteners 109 and the second portions are attached to the side surfaces of the body portion 301 via, for example, fasteners similar to the fasteners 108. The first portions comprise the openings 305. The cable trays 303-1, 303-2, 303-3 and 303-4 are attached to the side surfaces of the body portion 301 above the brackets 302-1 and 302-2.

Figure 6:
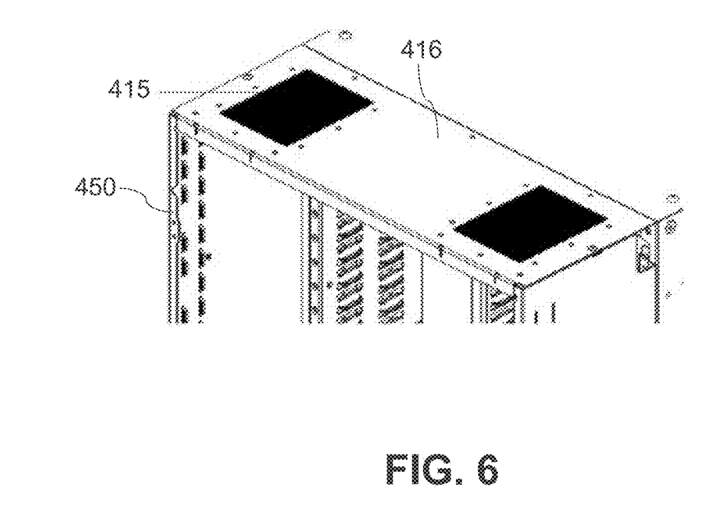
FIG. 6 depicts a schematic perspective view of a rack top brush panel installed on an electronic equipment rack in an illustrative embodiment.

FIG. 6 depicts a schematic perspective view of a rack top brush panel 416 installed on an electronic equipment rack 450 in an illustrative embodiment. The rack top brush panel 416 includes brush panels 415 providing a path for cables to pass into and out of the electronic equipment rack 450. The brush panels 415 may correspond to and line up with one or more openings 105, 205 or 305 in brackets 102-1/202-1/302-1 or 102-2/202-2/302-2 installed on a top surface of the electronic equipment rack 450 as part of a cable supporting and routing assembly 100, 200 or 300. Cables may be routed though the bracket openings 105, 205 or 305 and corresponding brush panels 415 to and/or from one or more cable trays 103, 203 or 303.

As noted herein, fastener holes may be threaded or not threaded. The fasteners, such as, for example, fasteners 107, 108, 109, 141, 142 and 166 may include, for example, drop pins, screws, bolts, nuts, washers and/or lock washers. The materials of the cable supporting and routing assembly 100, 200 or 300, including, for example, the body portions 101/202/301, the brackets 102-1/202-1/302-1 or 102-2/202-2/302-2 and the cable trays 103, 203 or 303, as well as the bottom closeout brackets 140 and the rack top brush panel 416 include, but are not necessarily limited to, stainless steel, aluminum, copper, bronze, brass, galvanized steel or alloys thereof (e.g., 304 and 304L ASTM A240 stainless steel plate, ASTM A551 carbon steel), fiberglass and/or one or more plastic materials. The materials of the brush panels 215/415 and of the blanking panels 314 and 324 include, but are not necessarily limited to, plastic, vinyl, plexiglass, polyamide, nylon or other appropriate materials. The number of holes and fasteners described herein may vary.

The embodiments advantageously provide a flexible and multi-purpose over-rack assembly that allows electronic equipment racks to be secured inside the modular datacenter and isolated from external forces and vibration, while providing pathways for power and data cables in different directions. The embodiments provide for the securing of electronic equipment racks to isolation structures without interfering with the natural routing of electronic equipment cables through the modular datacenter and the racks, and in conformance with cabling requirements.

Electronic equipment racks typically vary in size and height. As an additional advantage, the embodiments provide a flexible channel strut structural system for supporting and routing electronic equipment wiring and cables between hot and cold aisles, which can be varied in size and configuration to conform to the differently configured electronic equipment racks. The embodiments further include configurations for cable trays and airflow containment brackets, which can be attached to body portions of the over-rack assemblies and to top surfaces of electronic equipment racks in different configurations. The airflow containment brackets and body portions include openings through which cables and/or other types of wiring can pass, and can accommodate brush panels or blanking panels positioned in or adjacent the openings.

The arrangements shown in the illustrative embodiments of FIGS. 1A through 6 are presented by way of example for purposes of illustration only, and alternative embodiments can utilize a wide variety of other types of cable supporting and routing assemblies, isolation elements, closeout brackets, brush panels and blanking panels. Accordingly, the particular configurations of components as shown in the figures can be varied in other embodiments. Moreover, the various assumptions made above in the course of describing the illustrative embodiments should also be viewed as exemplary rather than as requirements or limitations of the invention. Numerous other alternative embodiments within the scope of the appended claims will be readily apparent to those skilled in the art.

What is claimed is:

1. An apparatus comprising:
   a body portion configured to be disposed above an electronic equipment rack;
   one or more first openings in the body portion, wherein the one or more first openings are configured for receiving a first plurality of cables routed through the one or more first openings; and
   at least one bracket attached to a side surface of the body portion and configured to be attached to a top surface of the electronic equipment rack, the at least one bracket comprising one or more second openings configured for receiving a second plurality of cables routed through the one or more second openings into the electronic equipment rack.

2. The apparatus of claim 1 further comprising one or more cable trays attached to the body portion, wherein the one or more cable trays are configured for supporting at least one of the first plurality of cables and the second plurality of cables.

3. The apparatus of claim 2 wherein a given cable tray of the one or more cable trays is attached to the side surface of the body portion above the at least one bracket.

4. The apparatus of claim 1 further comprising one or more brush panels disposed one of in and adjacent at least one of the first and second openings.

5. The apparatus of claim 1 further comprising one or more third openings in the body portion, wherein one or more blanking panels are disposed one of in and adjacent the one or more third openings.

6. The apparatus of claim 1 wherein the at least one bracket comprises an L-shape including a first portion and a second portion perpendicular to the first portion, wherein the first portion is configured to be attached to the top surface of the electronic equipment rack in an orientation parallel to the top surface of the electronic equipment rack.

7. The apparatus of claim 6 wherein the second portion is attached to the side surface of the body portion.

8. The apparatus of claim 6 wherein the first portion comprises the one or more second openings.

9. The apparatus of claim 1 wherein the body portion is further configured to be attached to one or more isolation elements, wherein the one or more isolation elements are attached to a ceiling of a modular datacenter, and wherein the one or more isolation elements are disposed between the body portion and the ceiling of the modular datacenter.

10. The apparatus of claim 1 further comprising at least one other bracket attached to another side surface of the body portion opposite to the side surface of the body portion to which the at least one bracket is attached, and configured to be attached to the top surface of the electronic equipment rack, wherein the at least one other bracket comprises one or more third openings configured for receiving a third plurality of cables routed through the one or more third openings into the electronic equipment rack.

11. The apparatus of claim 1 wherein:
the electronic equipment rack is disposed on a top surface of a base portion; and
a plurality of isolation elements are disposed below a bottom surface of the base portion.

12. The apparatus of claim 11 wherein the plurality of isolation elements are disposed between the bottom surface of the base portion and portions of a floor of a modular datacenter.

13. The apparatus of claim 12 wherein the plurality of isolation elements are respectively coupled to corresponding ones of the portions of the floor of the modular datacenter via one or more fasteners.

14. A method comprising:
supporting a plurality of cables in at least one cable tray above an electronic equipment rack, wherein the at least one cable tray is attached to an over-rack assembly, the over-rack assembly comprising:
a body portion disposed above the electronic equipment rack and attached to one or more isolation elements, wherein the one or more isolation elements are attached to a ceiling of a modular datacenter;
one or more first openings in the body portion; and
at least one bracket attached to a side surface of the body portion and to a top surface of the electronic equipment rack, the at least one bracket comprising one or more second openings;
routing a first portion of the plurality of cables through the one or more first openings; and
routing a second portion of the plurality of cables through the one or more second openings into the electronic equipment rack.

15. The method of claim 14 further comprising disposing one or more brush panels one of in and adjacent at least one of the first and second openings, wherein at least one of the first portion and the second portion of the plurality of cables are routed through the one or more brush panels.

16. The method of claim 14 wherein the body portion comprises one or more third openings, and the method further comprises disposing one or more blanking panels in the one or more third openings.

17. The method of claim 14 wherein the one or more isolation elements are disposed between the body portion and the ceiling of the modular datacenter.

18. An electronic equipment rack comprising:
a top surface; and
an over-rack assembly, wherein the over-rack assembly comprises:
a body portion disposed above the top surface of the electronic equipment rack and attached to a ceiling of a modular datacenter;
a first bracket attached to a first side surface of the body portion and to the top surface of the electronic equipment rack, wherein the first bracket comprises one or more first openings configured for receiving a first plurality of cables routed through the one or more first openings into the electronic equipment rack; and
a second bracket attached to a second side surface of the body portion and to the top surface of the electronic equipment rack, wherein the second bracket comprises one or more second openings configured for receiving a second plurality of cables routed through the one or more second openings into the electronic equipment rack.

19. The electronic equipment rack of claim 18, wherein the body portion is attached to the ceiling of the modular datacenter via one or more isolation elements disposed between the body portion and the ceiling of a modular datacenter.

20. The electronic equipment rack of claim 18, wherein the body portion comprises one or more third openings in the body portion, wherein the one or more third openings are configured for receiving a third plurality of cables routed through the one or more third openings.

21. The electronic equipment rack of claim 18 wherein the over-rack assembly further comprises a first cable tray attached to the first side surface of the body portion and a second cable tray attached to the second side surface of the body portion, wherein the first and second cable trays are configured for respectively supporting the first plurality of cables and the second plurality of cables.

22. The electronic equipment rack of claim 18 wherein the over-rack assembly further comprises one or more brush panels disposed one in and adjacent at least one of the first and second openings.

23. The electronic equipment rack of claim 18 wherein each of the first and second brackets comprises an L-shape including a first portion parallel to the top surface of the electronic equipment rack and a second portion perpendicular to the first portion.

\* \* \* \* \*